US011874068B2

(12) United States Patent
Inagaki et al.

(10) Patent No.: US 11,874,068 B2
(45) Date of Patent: Jan. 16, 2024

(54) VAPOR CHAMBER

(71) Applicant: FURUKAWA ELECTRIC CO., LTD., Tokyo (JP)

(72) Inventors: Yoshikatsu Inagaki, Tokyo (JP); Hirofumi Aoki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 18/053,481

(22) Filed: Nov. 8, 2022

(65) Prior Publication Data

US 2023/0069333 A1 Mar. 2, 2023

Related U.S. Application Data

(63) Continuation of application No. PCT/JP2021/040970, filed on Nov. 8, 2021.

(30) Foreign Application Priority Data

Nov. 20, 2020 (JP) .................................. 2020-193330

(51) Int. Cl.
*F28D 15/04* (2006.01)
*F28D 15/02* (2006.01)
*F28D 21/00* (2006.01)

(52) U.S. Cl.
CPC ....... *F28D 15/046* (2013.01); *F28D 15/0233* (2013.01); *F28D 2021/0029* (2013.01)

(58) Field of Classification Search
CPC ............... F28D 15/046; F28D 15/0233; F28D 2021/0029; C01B 3/00; H01L 23/26; F17C 11/005
See application file for complete search history.

(56) References Cited

U.S. PATENT DOCUMENTS 4,043,387 A * 8/1977 Lamp .................. F28D 15/0258
165/104.27
4,586,561 A * 5/1986 Franco .................... C01C 1/024
165/104.27

(Continued)

FOREIGN PATENT DOCUMENTS

CN 111322891 A 6/2020
JP S618595 A 1/1986

(Continued)

OTHER PUBLICATIONS

[English Translation] Decision of Refusal dated Sep. 27, 2022 for Taiwanese Patent Application No. 110142372, pp. all.

(Continued)

*Primary Examiner* — Tho V Duong
(74) *Attorney, Agent, or Firm* — Dorsey & Whitney LLP (57) ABSTRACT

A vapor chamber has: a container in which a cavity portion is formed in an inside; a wick structure provided in the cavity portion; a working fluid enclosed in the cavity portion; a vapor flow path which is formed in the cavity portion and through which the working fluid in a gas phase flows; and a hydrogen occlusion metal that is disposed in the cavity portion and absorbs hydrogen at 350° C. or lower and does not release hydrogen at 350° C. or lower, the hydrogen occlusion metal being coated in a region in contact with the working fluid in an inner surface of the cavity portion and/or the wick structure.

10 Claims, 8 Drawing Sheets

(56) References Cited

U.S. PATENT DOCUMENTS

| | | | | |
|---|---|---|---|---|
| 4,884,628 A | * | 12/1989 | En-Jian | F28D 15/0258 |
| | | | | 165/917 |
| 5,566,751 A | * | 10/1996 | Anderson | F28D 15/0258 |
| | | | | 165/104.27 |
| 5,645,626 A | * | 7/1997 | Edlund | B01D 63/08 |
| | | | | 95/56 |
| 6,110,808 A | * | 8/2000 | Saito | H01L 23/26 |
| | | | | 257/E23.137 |
| 6,209,625 B1 | * | 4/2001 | Guo | F28D 15/0258 |
| | | | | 165/104.27 |
| 2019/0024984 A1 | | 1/2019 | Aoki et al. | |

FOREIGN PATENT DOCUMENTS

| | | |
|---|---|---|
| JP | 2010060206 A | 3/2010 |
| JP | 3186291 U | 9/2013 |
| JP | 2019105398 A | 6/2019 |
| TW | 201307716 A | 2/2013 |
| WO | 2017150356 A1 | 9/2017 |
| WO | 2019026786 A1 | 2/2019 |

OTHER PUBLICATIONS

[English Translation] Notice of the Opinion on Examination dated Jun. 14, 2022 for Taiwanese Patent Application No. 110142372, pp. all.

International Search Report and Written Opinion (English Translation on ISR only) dated Dec. 14, 2021 for International Patent Application No. PCT/JP2021/040970; pp. all.

[English Translation] Decision to Grant a Patent for Japanese Patent Application No. 2020-193330 dated Jun. 14, 2021, 4 pages.

Office Action dated Apr. 26, 2023 in TW Application No. 110142372; pp. all.

* cited by examiner

VAPOR CHAMBER

CROSS REFERENCE TO RELATED APPLICATIONS

The present application is a continuation application of International Patent Application No. PCT/JP2021/040970 filed on Nov. 8, 2021, which claims the benefit of Japanese Patent Application No. 2020-193330, filed on Nov. 20, 2020. The contents of these applications are incorporated herein by reference in their entirety.

BACKGROUND

Technical Field

The present disclosure relates to a vapor chamber that reduces a non-condensable gas such as hydrogen gas present inside a container and thereby exerts excellent heat transfer properties.

Background

Amounts of heat generated by electronic components such as semiconductor elements mounted, for example, on electric/electronic devices or vehicles have been increased with enhanced functionality, higher-density mounting due to size reduction, and the like of the electric/electronic devices or vehicles. In addition, such an electronic component may be disposed in a narrow space. Cooling of the electronic component generating an increased amount of heat and disposed in a narrow space has recently become more important. As a method of cooling the above-mentioned electronic component, a vapor chamber or a heat pipe may be used.

For a container of the vapor chamber or the heat pipe, a material such as copper, a copper-based alloy, iron, a ferroalloy, stainless steel, aluminum, an aluminum-based alloy, nickel, a nickel-based alloy (for example, Inconel (R)) is used in view of mechanical strength and the like and compatibility with a working fluid. However, compatibility between the container and the working fluid, mixing of impurities into the inside of the container, and the like may cause a reaction between the container and the working fluid, and thus generation of a non-condensable gas such as hydrogen gas. When the non-condensable gas such as hydrogen gas is present inside the container, the non-condensable gas does not contribute to heat transfer with latent heat and deteriorates a vacuum state inside the container, which degrades heat transfer properties of the vapor chamber or the heat pipe.

Accordingly, a heat pipe is proposed in which hydrogen gas removers containing a metal such as cupric oxide are provided in a condensation portion to remove hydrogen gas generated due to a chemical reaction between a working fluid and a container, and the hydrogen gas removers are fitted into a plurality of portions in an inner wall surface of the condensation portion in a contact manner (Japanese Patent Laid-Open No. 2010-60206).

However, in Japanese Patent Laid-Open No. 2010-60206 involving the hydrogen gas removers fitted into the container, hydrogen is removed using the oxidation-reduction reaction of the metal oxide, and the surface of the metal oxide mainly contributes to the reaction. As a result, a capacity for removing hydrogen gas is not sufficiently exerted. In addition, in Japanese Patent Laid-Open No. 2010-60206, the hydrogen gas removers are reduced and metal ions, for example, of copper, lead, and barium are dissolved in the working fluid, which degrades the reliability of the heat transfer operation. Further, in Japanese Patent Laid-Open No. 2010-60206 involving the hydrogen gas removers fitted into the container, the volume of the internal space of the container is required to be increased for smooth circulation of the gas-phase working fluid. In recent years, since the installation space for the electronic component has increasingly become narrower, Japanese Patent Laid-Open No. 2010-60206 is difficult to be applied to cooling of the electronic component installed in a narrow space.

SUMMARY

The present disclosure is related to providing a vapor chamber that is excellent in absorption properties for a non-condensable gas such as hydrogen gas and applicable to cooling of an object to be cooled that is installed in a narrow space.

Outlines of components of the present disclosure are as follows.

[1] A vapor chamber having: a container in which a cavity portion is formed in an Inside; a wick structure provided in the cavity portion; a working fluid enclosed in the cavity portion; a vapor flow path which is formed in the cavity portion and through which the working fluid in a gas phase flows; and a hydrogen occlusion metal that is disposed in the cavity portion and absorbs hydrogen at 350° C. or lower and does not release hydrogen at 350° C. or lower, the hydrogen occlusion metal being coated in a region in contact with the working fluid in an inner surface of the cavity portion and/or the wick structure.

[2] The vapor chamber according to [1], wherein the container is a planar container that is formed by one plate-shaped body and another plate-shaped body facing the one plate-shaped body.

[3] The vapor chamber according to [1] or [2], wherein the hydrogen occlusion metal is disposed in a section where the working fluid condenses.

[4] The vapor chamber according to any one of [1] to [3], wherein the coating of the hydrogen occlusion metal is at least one layer selected from the group consisting of a plating layer, a sputtering layer, and a vapor deposition layer.

[5] The vapor chamber according to any one of [1] to [4], a ratio of a thickness of the vapor flow path directly above the coating of the hydrogen occlusion metal to a thickness of the coating of the hydrogen occlusion metal is 0.50 or greater and 20 or lower.

[6] The vapor chamber according to any one of [1] to [5], wherein an average thickness of the coating of the hydrogen occlusion metal is 0.01 mm or greater and 0.10 mm or lower.

[7] The vapor chamber according to any one of [1] to [6], wherein the hydrogen occlusion metal is a titanium-based material, a palladium-based material, a vanadium-based material, a calcium-based material, or a composite material of these materials.

[8] The vapor chamber according to any one of [1] to [7], wherein the hydrogen occlusion metal is a composite material of titanium and palladium.

[9] The vapor chamber according to any one of [1] to [8], wherein a material of the container is copper, a copper-based alloy, iron, a ferroalloy, stainless steel, aluminum, an aluminum-based alloy, nickel, or a nickel-based alloy.

[10] The vapor chamber according to any one of [1] to [9], wherein a material of the container is stainless steel.

[11] The vapor chamber according to any one of [1] to [10], wherein an amount of hydrogen gas in the cavity portion is 10% by volume or lower of a total amount of gases in the cavity portion at an operation temperature of 50° C.

[12] A heat sink having the vapor chamber according to any one of [1] to [11].

According to an aspect of the vapor chamber of the present disclosure, the hydrogen occlusion metal is coated in a region of the inner surface of the cavity portion of the container and/or the wick structure, so that the hydrogen occlusion metal is thinned. As a result, even when the volume of the container is reduced, the vapor flow path through which the gas-phase working fluid flows can be secured. As described above, in the vapor chamber of the present disclosure, the non-condensable gas such as hydrogen gas can sufficiently be in contact with the hydrogen occlusion metal even when the volume of the container is reduced. Therefore, in the vapor chamber of the present disclosure, excellent cooling properties can be exerted even on an object to be cooled that is installed in a narrower space.

According to an aspect of the vapor chamber of the present disclosure, since the hydrogen occlusion metal is disposed in a region in contact with the working fluid in the inner surface of the cavity portion of the container and/or the wick structure, the absorption properties for the non-condensable gas such as hydrogen gas is excellent and excellent heat transfer properties can be exerted over the long term.

According to an aspect of the vapor chamber of the present disclosure, since the container is a planar container that is formed by the one plate-shaped body and the other plate-shaped body facing the one plate-shaped body, the cooling properties can be surely exerted even on an object to be cooled that is installed in a narrower space.

According to an aspect of the vapor chamber of the present disclosure, although the non-condensable gas such as hydrogen gas does not condense and is still present in a gas phase even in a condensation portion, having a tendency not to circulate from the condensation portion to an evaporation portion and to stay in the condensation portion, the hydrogen occlusion metal is disposed in a section where the working fluid condenses, and thus the non-condensable gas is surely absorbed by the hydrogen occlusion metal in the condensation portion and more excellent heat transfer properties can be exerted.

According to an aspect of the vapor chamber of the present disclosure, since the coating of the hydrogen occlusion metal is at least one layer selected from the group consisting of a plating layer, a sputtering layer, and a vapor deposition layer, and the coating of the hydrogen occlusion metal surely thinned, more excellent cooling properties can be exerted on an object to be cooled that is installed in a narrow space.

According to an aspect of the vapor chamber of the present disclosure, since a ratio of a thickness of the vapor flow path directly above the coating of the hydrogen occlusion metal to a thickness of the coating of the hydrogen occlusion metal is 0.50 or greater and 20 or lower, the absorption properties of the hydrogen occlusion metal for the non-condensable gas and the flowing properties for the gas-phase working fluid can be improved in balance.

According to an aspect of the vapor chamber of the present disclosure, since the hydrogen occlusion metal is a composite material of a titanium-based material and a palladium-based material, an absorption capacity for the non-condensable gas such as hydrogen gas can be improved and more excellent heat transfer properties can be exerted.

DETAILED DESCRIPTION

Figure 1:
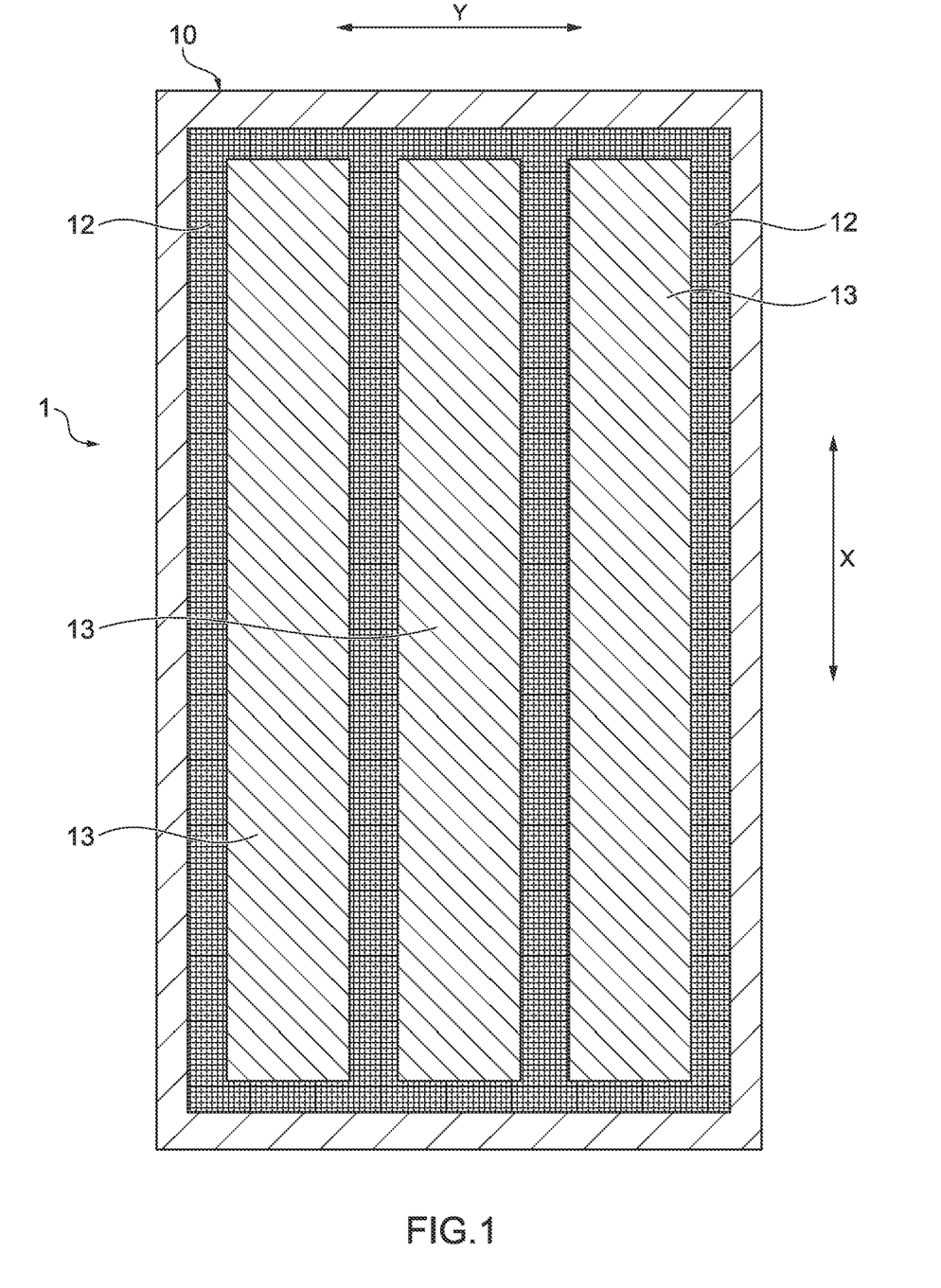
FIG. 1 is a plan sectional view illustrating an outline of a vapor chamber according to a first exemplary embodiment of the present disclosure.
Figure 2:
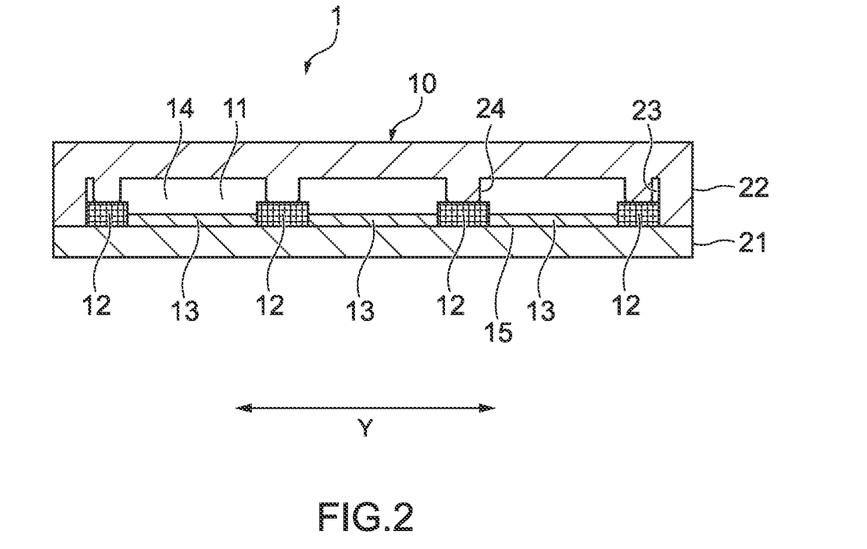
FIG. 2 is a side sectional view illustrating an outline of the vapor chamber according to the first exemplary embodiment of the present disclosure.

Hereinafter, vapor chambers according to exemplary embodiments of the present disclosure will be described with reference to the accompanying drawings. First, a vapor chamber according to a first exemplary embodiment of the present disclosure will be described with reference to the accompanying drawings. FIG. 1 is a plan sectional view illustrating an outline of the vapor chamber according to the first exemplary embodiment of the present disclosure. FIG. 2 is a side sectional view illustrating an outline of the vapor chamber according to the first exemplary embodiment of the present disclosure.

As illustrated in FIGS. 1 and 2, a vapor chamber 1 according to the first exemplary embodiment has a container 10 in which a cavity portion 11 is formed in an inside, a wick structure 12 contained in the cavity portion 11, a working fluid (not illustrated) enclosed in the cavity portion 11, a vapor flow path 14 which is formed in the cavity portion 11 and through which the working fluid in a gas phase flows, and a hydrogen occlusion metal 13 disposed in the cavity portion 11. The hydrogen occlusion metal 13 is a metal that absorbs hydrogen at 350° C. or lower and does not release hydrogen at 350° C. or lower.

As illustrated in FIG. 2, the container 10 is a planar container that is formed by superposing two plate-shaped bodies facing each other, that is, one plate-shaped body 21 and another plate-shaped body 22 facing the one plate-shaped body 21. The cavity portion 11 is formed inside the container 10 by superposing the one plate-shaped body 21 and the other plate-shaped body 22.

The one plate-shaped body 21 and the other plate-shaped body 22 each are a plate-shaped member. The central portion of the other plate-shaped body 22 is provided with a recessed portion 23 viewed from the one plate-shaped body 21. In other words, the other plate-shaped body 22 has a recessed portion 23 on a surface facing the one plate-shaped body 21. On the other hand, the central portion of the one plate-shaped body 21 is provided with no recessed portion and is planar. Therefore, the recessed portion 23 of the other plate-shaped body 22 forms the cavity portion 11 of the container 10. In other words, the hollow portion of the container 10 formed by the inner surface of the recessed portion 23 of the other plate-shaped body 22 and the inner surface of the one plate-shaped body 21 is the cavity portion 11.

Since the container 10 is a planar container that is formed by the one plate-shaped body 21 and the other plate-shaped body 22 facing the one plate-shaped body 21, the cooling properties can be surely exerted even on an object to be cooled that is installed in a narrower space.

The cavity portion 11 is a sealed space and is decompressed by deaeration. To maintain the internal space of the decompressed cavity portion 11, a plurality of protruding portions 24 protruding toward the one plate-shaped body 21 are provided on the inner surface of the other plate-shaped body 22. Each protruding portion 24 serves as a support body to prevent the other plate-shaped body 22 from being deformed toward the one plate-shaped body 21 by atmospheric pressure and the one plate-shaped body 21 from being deformed toward the other plate-shaped body 22 by atmospheric pressure.

The internal space of the cavity portion 11 serves as the vapor flow path 14 through which the gas-phase working fluid flows. The gas-phase working fluid flows through the vapor flow path 14 from an evaporation portion to a condensation portion.

The shapes in plan view of the container 10 and the cavity portion 11 (an aspect viewed from the vertical direction with respect to the planar portion of the vapor chamber 1) are not particularly limited, and can be appropriately selected depending on usage conditions of the vapor chamber 1, for example, including a polygonal shape and a shape having a bent portion. In FIG. 1, the shapes in plan view of the container 10 and the cavity portion 11 are both rectangular.

The hydrogen occlusion metal 13 is provided on the inner surface 15 of the cavity portion 11. In the vapor chamber 1, the hydrogen occlusion metal 13 is provided on the inner surface 15 of the one plate-shaped body 21. The hydrogen occlusion metal 13 is disposed on the inner surface 15 of the cavity portion 11 in a state of being exposed to the cavity portion 11 to take an aspect of being in direct contact with the gas-phase working fluid flowing through the vapor flow path 14. The hydrogen occlusion metal 13 is coated on the inner surface 15 of the cavity portion 11 (in the vapor chamber 1, the inner surface 15 of the one plate-shaped body 21) so as to be provided in a region in contact with the working fluid. Therefore, the hydrogen occlusion metal 13 is a coating layer formed on the inner surface 15 of the cavity portion 11. As described above, the hydrogen occlusion metal 13 is integrated with the inner surface 15 of the cavity portion 11.

The hydrogen occlusion metal 13 is disposed, for example, in a section of the cavity portion 11 where the working fluid condenses. As illustrated in FIGS. 1 and 2, in the vapor chamber 1, the coating of the hydrogen occlusion metal 13 extends along the longitudinal direction X of the cavity portion 11 from one end to the other end of the cavity portion 11 in a fence-shaped manner. In addition, the coating of the hydrogen occlusion metal 13 is provided in a plurality of rows along the lateral direction Y of the cavity portion 11. As described above, in the vapor chamber 1, the hydrogen occlusion metal 13 is provided substantially in the entire cavity portion 11 including the section where the working fluid condenses. In other words, in the vapor chamber 1, the hydrogen occlusion metal 13 is provided in both the evaporation portion and the condensation portion of the container 10.

A method of forming the coating of the hydrogen occlusion metal 13 may include a film forming method, for example, plating, sputtering, and vapor deposition such as vacuum vapor deposition. As described above, a coating aspect of the hydrogen occlusion metal 13 may include a plating layer, a sputtering layer, a vapor deposition layer, and the like. Since the coating of the hydrogen occlusion metal 13 is a plating layer, a sputtering layer, a vapor deposition layer, or the like, the thinned hydrogen occlusion metal 13 can be surely obtained.

An average thickness of the coating of the hydrogen occlusion metal 13 is not particularly limited, but the lower limit of the average thickness is preferably 0.01 mm, and particularly preferably 0.02 mm, in that the absorption properties for the non-condensable gas such as hydrogen gas are surely imparted to the hydrogen occlusion metal 13. On the other hand, the upper limit of the average thickness of the coating of the hydrogen occlusion metal 13 is preferably 0.10 mm, and particularly preferably 0.08 mm, in that the vapor flow path 14 through which the gas-phase working fluid flows is ensured even when the volume of the container 10 is reduced, for example, when the container 10 is thinned.

A ratio of a thickness of the vapor flow path 14 directly above the coating of the hydrogen occlusion metal 13 to a thickness of the coating of the hydrogen occlusion metal 13 is not particularly limited, but is preferably 0.50 or greater and 20 or lower, more preferably 1.0 or greater and 15 or lower, and particularly preferably 2.0 or greater and 10 or lower, in that the absorption properties of the hydrogen occlusion metal 13 for the non-condensable gas such as hydrogen gas and the flowing properties for the gas-phase working fluid are improved in balance.

A dimension of the container 10 can be appropriately selected depending on usage states such as restrictions on the installation space of the vapor chamber 1, and may include 10 mm to 100 mm×10 mm to 200 mm in plan view and 0.05 mm to 5.0 mm in thickness, for example.

A material of the hydrogen occlusion metal 13 is not particularly limited as long as being a metal that absorbs hydrogen at 350° C. or lower and does not release hydrogen at 350° C. or lower, and may include a titanium-based material, a palladium-based material, a vanadium-based material, a calcium-based material, and a composite material of these materials, for example. Among these materials, a composite material of a titanium-based material and a palladium-based material is preferable in that an absorption capacity for the non-condensable gas such as hydrogen gas can be improved and more excellent heat transfer properties can be imparted to the vapor chamber 1. The composite material of a titanium-based material and a palladium-based material may include a composite material having a laminated structure of a titanium-based layer and a palladium-based layer in order from the inner surface 15 side of the cavity portion 11, for example.

As illustrated in FIGS. 1 and 2, in the vapor chamber 1, the wick structure 12 is provided substantially in the entire plane direction of the cavity portion 11. The wick structure 12 is provided on the inner surface 15 of the one plate-shaped body 21 forming the cavity portion 11. Further, the wick structure 12 is interposed between the protruding portion 24 of the other plate-shaped body 22 and the one plate-shaped body 21 to take an aspect of being fixed in the container 10. The shape in plan view of the wick structure 12 is not particularly limited, and in the vapor chamber 1, the wick structure 12 is disposed in a section not being provided with the hydrogen occlusion metal 13 in the inner surface 15 of the one plate-shaped body 21 forming the cavity portion 11. Therefore, either the coating of the hydrogen occlusion metal 13 or the wick structure 12 is disposed all over the inner surface 15 of the one plate-shaped body 21 forming the cavity portion 11. As described above, the space formed among the other plate-shaped body 22, the hydrogen occlusion metal 13, and the wick structure 12 serves as the vapor flow path 14.

A structure of the wick structure 12 is not particularly limited as long as being capable of generating capillary force, and may include a metal mesh (a braided body of metal wires), a filament body of metal wires, and a sintered body of metal powders, for example. The wick structure 12 may have a groove structure in which a plurality of fine grooves are provided in the inner surface 15 of the cavity portion 11.

A material of the container 10 is not particularly limited, and may include copper, copper-based alloys, iron, ferroalloys, stainless steel, aluminum, aluminum-based alloys, nickel, and nickel-based alloys (for example, Inconel (R)), for example. Among these materials, stainless steel is preferable in view of durability and thermal conductivity of the container 10.

A material of the wick structure 12 can be appropriately selected depending on usage states, and may include copper, copper-based alloys, iron, ferroalloys, stainless steel, aluminum, aluminum-based alloys, nickel, and nickel-based alloys (for example, Inconel (R)). The material of the wick structure 12 may be the same as or different from the material of the container 10.

The working fluid enclosed in the cavity portion 11 can be appropriately selected depending on compatibility with the materials of the container 10 and the wick structure 12, and may include water, alternative fluorocarbons, perfluorocarbons, and cyclopentane, for example.

In the container 10, a heating element (not illustrated) is thermally connected in a desirable position, and the position serves as the evaporation portion. Further, in the container 10, a section different from the evaporation portion is thermally connected to a heat exchange means (not illustrated) such as a radiator fin or is air-cooled, and the section serves as the condensation portion.

The liquid-phase working fluid that has received heat from the heating element undergoes a phase change from liquid to gas in the evaporation portion of the container 10, and the gas-phase working fluid flows from the evaporation portion to the condensation portion in the container 10. As a result, the heat transferred from the heating element to the working fluid is transferred to the condensation portion of the container 10. The gas-phase working fluid undergoes a phase change to liquid in the condensation portion of the container 10 and discharges latent heat, and the liquid-phase working fluid circulates from the condensation portion to the evaporation portion in the container 10 by the capillary force of the wick structure 12. On the other hand, the non-condensable gas such as hydrogen gas does not condense and is still present in a gas phase even in the condensation portion of the container 10, having a tendency not to circulate from the condensation portion to the evaporation portion and to stay in the condensation portion. Therefore, as described above, the section where the hydrogen occlusion metal 13 is disposed is preferably arranged at least in the condensation portion in view of efficient absorption of the non-condensable gas such as hydrogen gas. An amount of the non-condensable gas such as hydrogen gas in the cavity portion 11 is, for example, 10% by volume or lower of the total amount of gases in the cavity portion 11 at an operation temperature of the vapor chamber 1 of 50° C., and more specifically 1.0% by volume or greater and 10% by volume or lower.

In the vapor chamber 1, the hydrogen occlusion metal 13 is coated on the inner surface 15 of the cavity portion 11, so that the hydrogen occlusion metal 13 is thinned. As a result, even when the volume of the container 10 is reduced, for example, when the container 10 is thinned, the vapor flow path 14 through which the gas-phase working fluid flows can be secured. Therefore, in the vapor chamber 1, the non-condensable gas such as hydrogen gas can sufficiently be in contact with the hydrogen occlusion metal 13 even when the container 10 is thinned. As described above, excellent cooling properties can be exerted by the vapor chamber 1 even on an object to be cooled that is installed in a narrower space. In particular, in the vapor chamber 1, since the hydrogen occlusion metal 13 is a plating layer, a sputtering layer, a vapor deposition layer, or the like, and the coating of the hydrogen occlusion metal 13 is surely thinned, excellent cooling properties can be exerted on an object to be cooled that is installed in a narrow space.

Further, in the vapor chamber 1, since the hydrogen occlusion metal 13 is disposed in a region of the inner surface 15 of the cavity portion 11 that is in contact with the working fluid, the absorption properties for the non-condensable gas such as hydrogen gas is excellent and excellent heat transfer properties can be exerted over the long term.

Further, in the vapor chamber 1, the hydrogen occlusion metal 13 is provided substantially in the entire cavity portion 11, and thus can surely absorb the non-condensable gas such hydrogen gas even when determination of the position to serve as the condensation portion is difficult depending on usage states of the vapor chamber 1 and the like. In addition, in the vapor chamber 1, since the hydrogen occlusion metal 13 is disposed in a section where the working fluid condenses, the non-condensable gas such as hydrogen gas is surely absorbed by the hydrogen occlusion metal 13 in the condensation portion and more excellent heat transfer properties can be exerted.

Further, even when the vapor chamber 1 reaches a temperature close to 300° C. in processing such as soldering and welding in a manufacturing process of the vapor chamber 1 and the non-condensable gas such as hydrogen gas is generated in the above-mentioned processing process, the non-condensable gas such as hydrogen gas can be prevented from being released to the cavity portion 11 since the hydrogen occlusion metal 13 that absorbs hydrogen at 350° C. or lower and does not release hydrogen at 350° C. or lower is provided in the vapor chamber 1. Consequently, the vapor chamber 1 having excellent heat transfer properties can be obtained even through the above-mentioned processing process.

Figure 3:
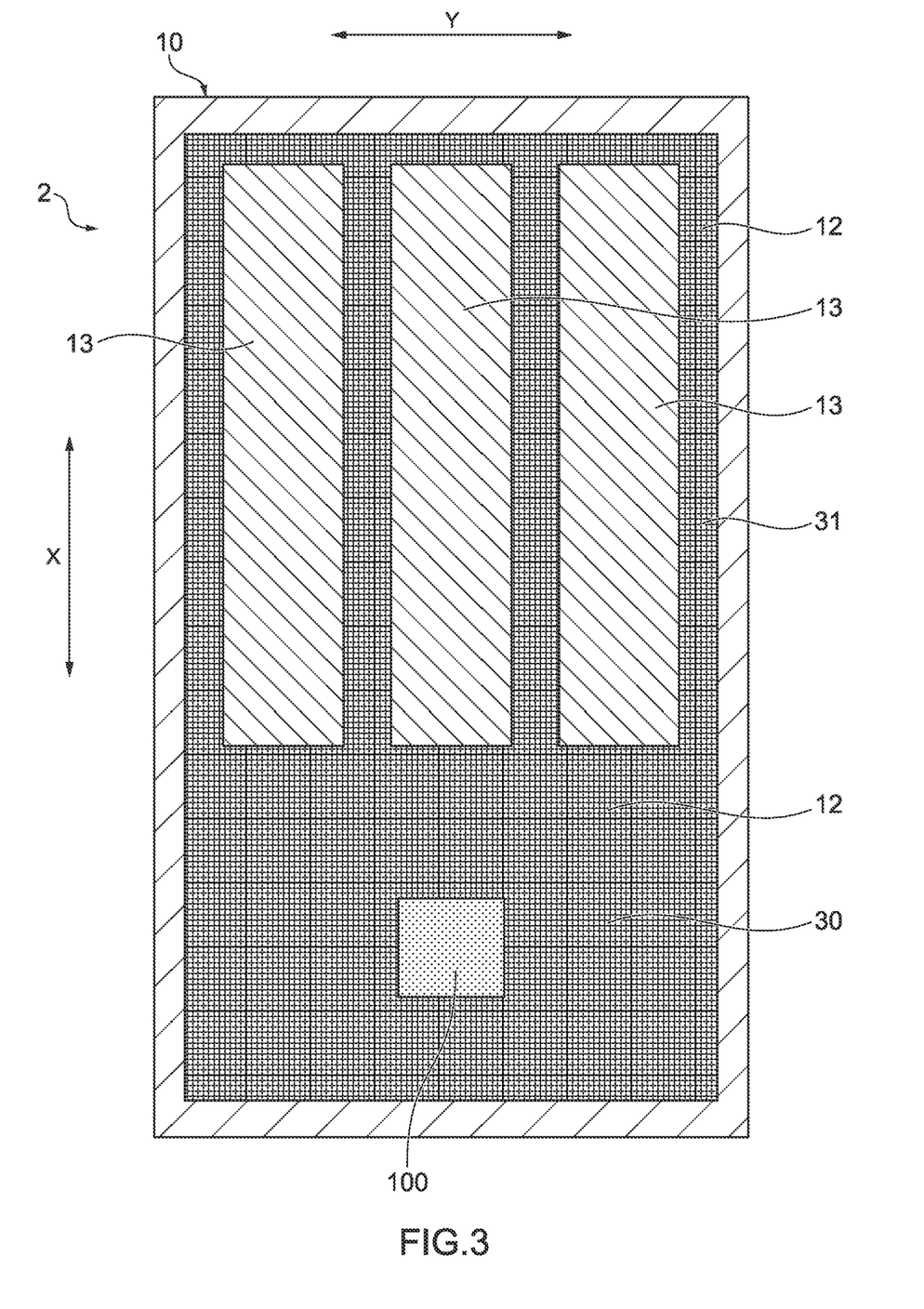
FIG. 3 is a plan sectional view illustrating an outline of a vapor chamber according to a second exemplary embodiment of the present disclosure.
Figure 4:
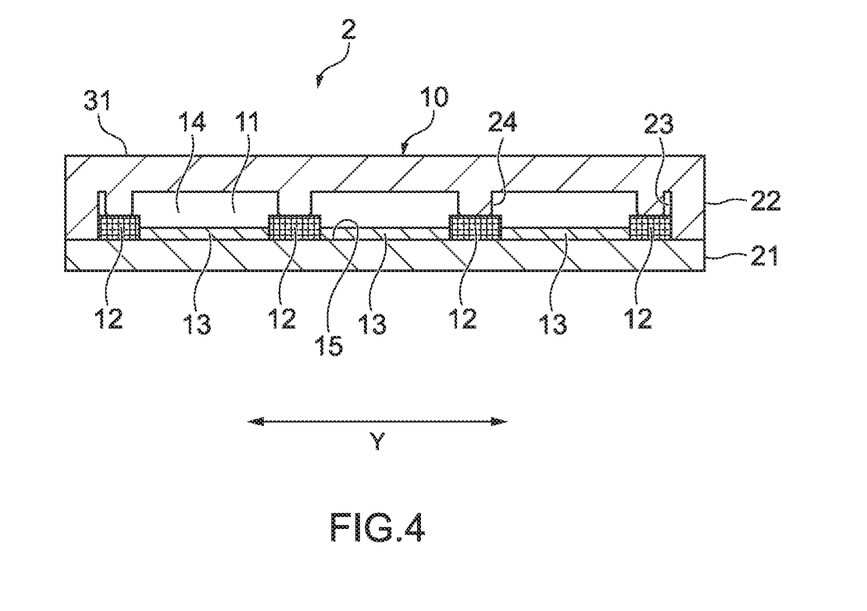
FIG. 4 is a side sectional view of the condensation portion illustrating an outline of the vapor chamber according to the second exemplary embodiment of the present disclosure.

Next, a vapor chamber according to a second exemplary embodiment of the present disclosure will be described with reference to the accompanying drawings. Main components of the vapor chamber according to the second exemplary embodiment are common to the vapor chamber according to the first exemplary embodiment, and the same components as those of the vapor chamber according to the first exemplary embodiment will be described using the same respective signs. FIG. 3 is a plan sectional view illustrating an outline of the vapor chamber according to the second exemplary embodiment of the present disclosure. FIG. 4 is a side sectional view of a condensation portion illustrating an outline of the vapor chamber according to the second exemplary embodiment of the present disclosure.

In the vapor chamber 1 according to the first exemplary embodiment, the coating of the hydrogen occlusion metal 13 is provided substantially on the entire inner surface 15 of the one plate-shaped body 21 forming the cavity portion 11, including the section where the working fluid condenses. However, in a vapor chamber 2 according to the second exemplary embodiment, the hydrogen occlusion metal 13 is not provided in an evaporation portion 30 thermally connected to a heating element 100, which is an object to be cooled, as illustrated in FIGS. 3 and 4. In other words, in the vapor chamber 2, the coating of the hydrogen occlusion metal 13 is not formed in the evaporation portion 30.

In the vapor chamber 2, the heating element 100 is thermally connected to an end portion of the container 10, and the hydrogen occlusion metal 13 is provided in a section 31 of the cavity portion 11 that is other than the evaporation portion 30 and includes the condensation portion. In other words, in the inner surface 15 of the one plate-shaped body 21 forming the cavity portion 11, the coating of the hydrogen occlusion metal 13 is not formed in the evaporation portion 30 and the coating of the hydrogen occlusion metal 13 is formed in the section 31 including the condensation portion.

In the vapor chamber 2, the hydrogen occlusion metal 13 extends along the longitudinal direction X of the cavity portion 11 from the central portion of the cavity portion 11 to the end portion on the section 31 side Including the condensation portion. In the region of the evaporation portion 30, the wick structure 12 is provided on the entire inner surface 15 of the one plate-shaped body 21 forming the cavity portion 11.

In the case where the heating element 100 is located in the end portion of the container 10 as for the vapor chamber 2, the non-condensable gas such as hydrogen gas can sufficiently be in contact with the hydrogen occlusion metal 13 even when the coating of the hydrogen occlusion metal 13 is not formed in the end portion on the evaporation portion 30 side. Therefore, also in the vapor chamber 2, excellent cooling properties can be exerted on an object to be cooled (heating element 100) that is installed in a narrow space. Further, in the vapor chamber 2, the hydrogen occlusion metal 13 is provided in the section 31 that is other than the evaporation portion 30 and includes the condensation portion, and thus can surely absorb the non-condensable gas such as hydrogen gas even when determination of the position to serve as the condensation portion is difficult depending on usage states of the vapor chamber 2 and the like.

Figure 5:
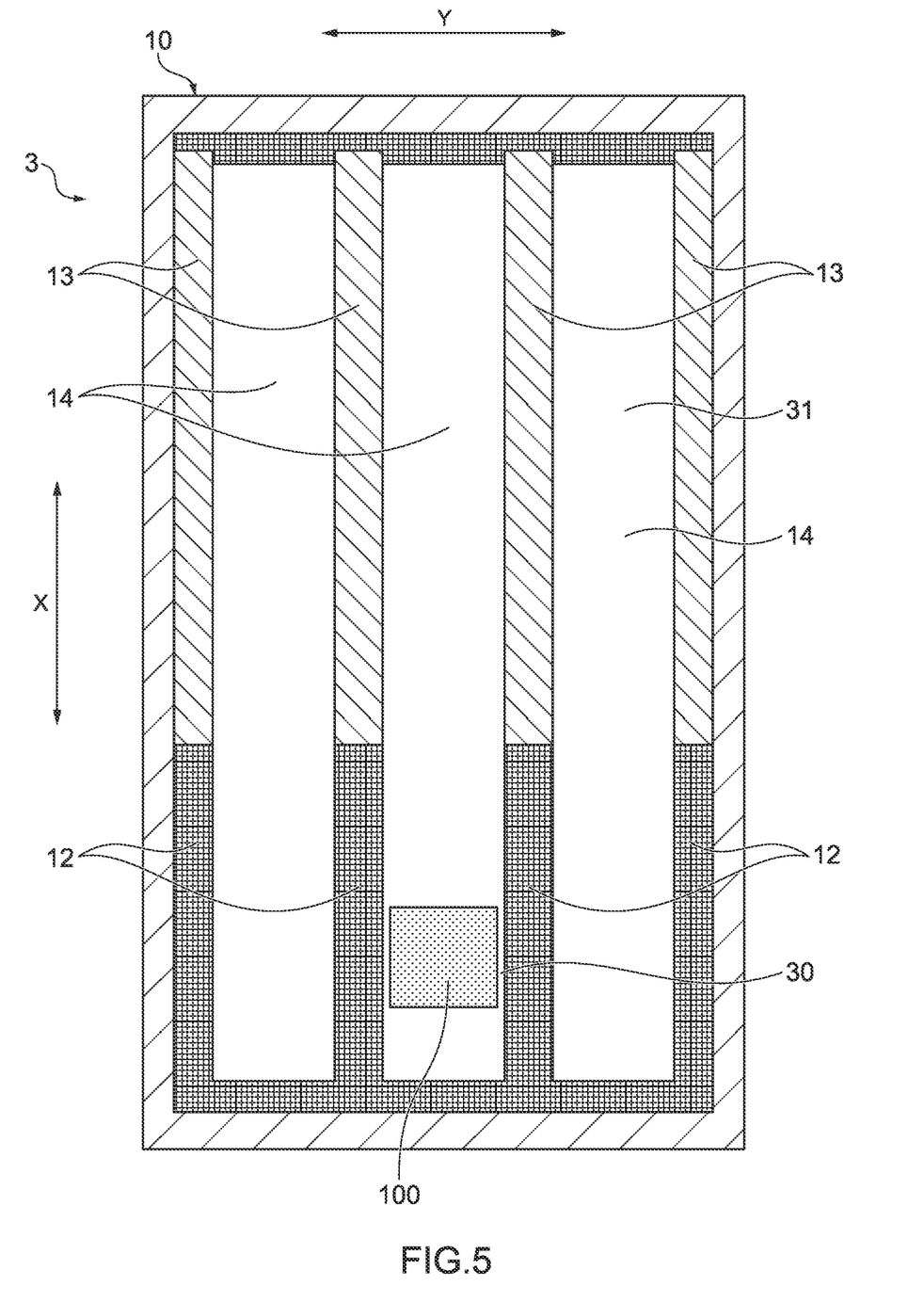
FIG. 5 is a plan sectional view illustrating an outline of a vapor chamber according to a third exemplary embodiment of the present disclosure.
Figure 6:
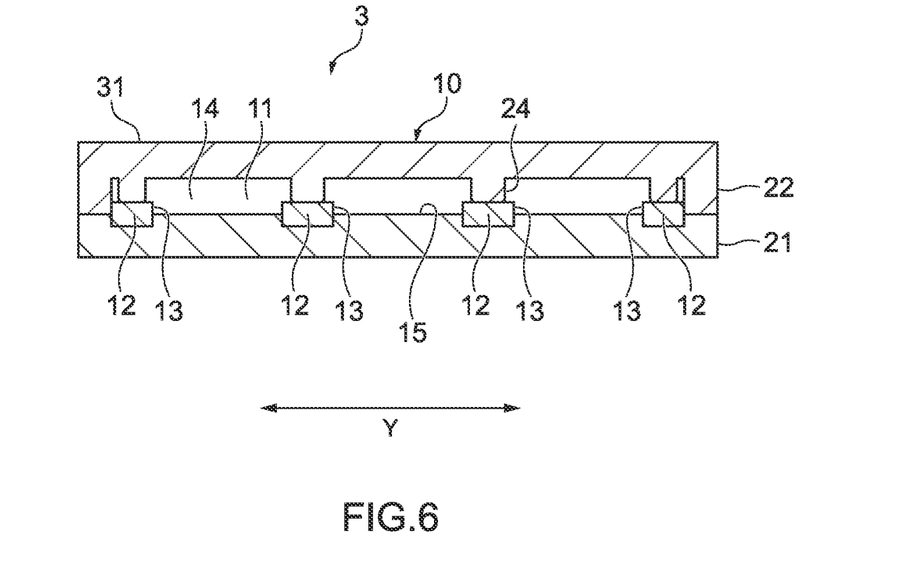
FIG. 6 is a side sectional view of the condensation portion illustrating an outline of the vapor chamber according to the third exemplary embodiment of the present disclosure.

Next, a vapor chamber according to a third exemplary embodiment of the present disclosure will be described with reference to the accompanying drawings. Main components of the vapor chamber according to the third exemplary embodiment are common to the vapor chambers according to the first and the second exemplary embodiments, and the same components as those of the vapor chambers according to the first and the second exemplary embodiments will be described using the same respective signs. FIG. 5 is a plan sectional view illustrating an outline of the vapor chamber according to the third exemplary embodiment of the present disclosure. FIG. 6 is a side sectional view of a condensation portion illustrating an outline of the vapor chamber according to the third exemplary embodiment of the present disclosure.

In the vapor chambers 1 and 2 according to the first and the second embodiments, the hydrogen occlusion metal 13 is coated on the inner surface 15 of the one plate-shaped body 21 forming the cavity portion 11. Instead, in a vapor chamber 3 according to the third exemplary embodiment, the hydrogen occlusion metal 13 is provided on the wick structure 12 as illustrated in FIGS. 5 and 6. In the vapor chamber 3, the hydrogen occlusion metal 13 is coated on the wick structure 12. As described above, the hydrogen occlusion metal 13 is integrated with the wick structure 12.

In the vapor chamber 3, the wick structure 12 extends along the longitudinal direction X of the cavity portion 11 from one end to the other end of the cavity portion 11 in a fence-shaped manner. In addition, the wick structure 12 is provided in a plurality of rows along the lateral direction Y of the cavity portion 11.

In the vapor chamber 3, the heating element 100 is thermally connected to an end portion of the container 10, and the hydrogen occlusion metal 13 is provided in the section 31 of the cavity portion 11 that is other than the evaporation portion 30 and includes the condensation portion. In other words, in the wick structure 12 extending from one end to the other end of the cavity portion 11 in a fence-shaped manner, the coating of the hydrogen occlusion metal 13 is not formed in the region of the evaporation portion 30 and the coating of the hydrogen occlusion metal 13 is formed in the region of the section 31 including the condensation portion.

In the vapor chamber 3, since the coating of the hydrogen occlusion metal 13 does not need to be formed on the inner surface 15 of the one plate-shaped body 21, the container 10 can be more thinned. Therefore, for the vapor chamber 3, installation in a narrower space, particularly a narrower space in the thickness direction is allowed. Further, also in the vapor chamber 3 having the hydrogen occlusion metal 13 provided on the wick structure 12, in the case where the heating element 100 is located in the end portion of the container 10, the non-condensable gas such as hydrogen gas can sufficiently be in contact with the hydrogen occlusion metal 13 even when the coating of the hydrogen occlusion metal 13 is not formed in the end portion on the evaporation portion 30 side. Therefore, also in the vapor chamber 3, excellent cooling properties can be exerted on an object to be cooled (heating element 100) that is installed in a narrow space. Further, also in the vapor chamber 3 having the hydrogen occlusion metal 13 provided on the wick structure 12, the hydrogen occlusion metal 13 is provided in the section 31 that is other than the evaporation portion 30 and includes the condensation portion, and thus can surely absorb the non-condensable gas such as hydrogen gas even when determination of the position to serve as the condensation portion is difficult depending on usage states of the vapor chamber 3 and the like.

Figure 7:
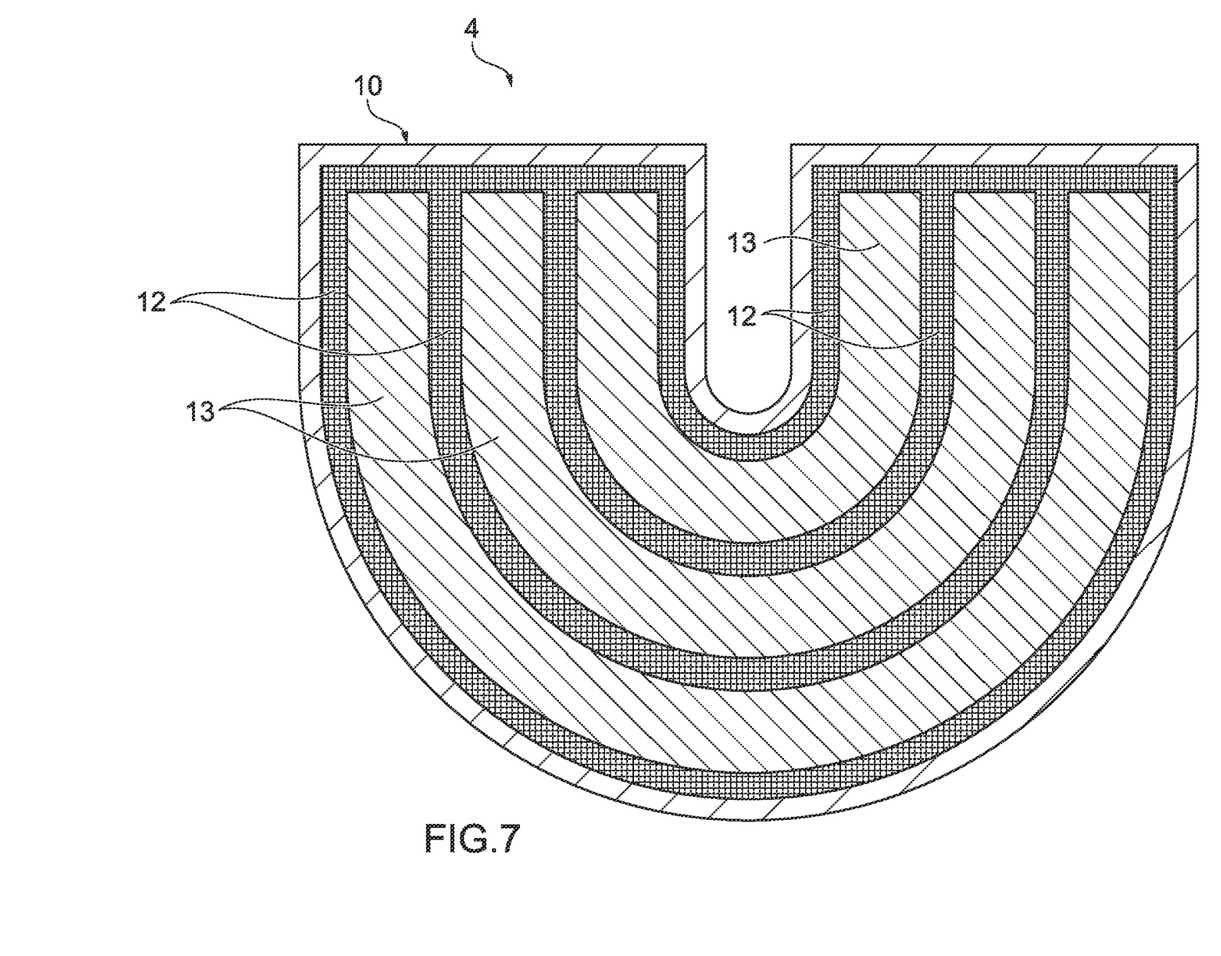
FIG. 7 is a plan sectional view illustrating an outline of a vapor chamber according to a fourth exemplary embodiment of the present disclosure.
Figure 8:
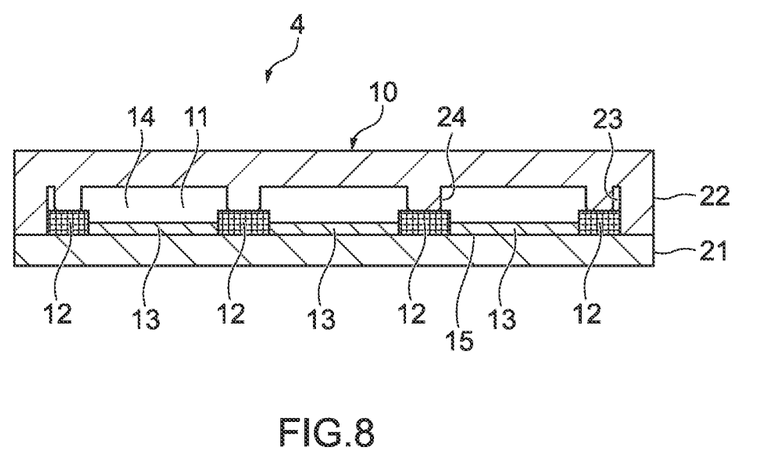
FIG. 8 is a side sectional view illustrating an outline of the vapor chamber according to the fourth exemplary embodiment of the present disclosure.

Next, a vapor chamber according to a fourth exemplary embodiment of the present disclosure will be described with reference to the accompanying drawings. Main components of the vapor chamber according to the fourth exemplary embodiment are common to the vapor chambers according to the first to the third exemplary embodiments, and the same components as those of the vapor chambers according to the first to the third exemplary embodiments will be described using the same respective signs. FIG. 7 is a plan sectional view illustrating an outline of the vapor chamber according to the fourth exemplary embodiment of the present disclosure. FIG. 8 is a side sectional view illustrating an outline of the vapor chamber according to the fourth exemplary embodiment of the present disclosure.

In the vapor chambers 1, 2 and 3 according to the first to the third exemplary embodiments, the shapes in plan view of the container 10 and the cavity portion 11 are rectangular. In a vapor chamber 4 according to the fourth exemplary embodiment, the shapes in plan view of the container 10 and the cavity portion 11 are not particularly limited, and the container 10 and the cavity portion 11 each have a U-shape in plan view as illustrated in FIG. 7.

The coating of the hydrogen occlusion metal 13 extends from one end to the other end of the cavity portion 11 having a U-shape in plan view. In other words, the coating of the hydrogen occlusion metal 13 has a U-shape in plan view corresponding to the shape in plan view of the cavity portion 11. As described above, in the vapor chamber 4, the hydrogen occlusion metal 13 is provided substantially in the entire cavity portion 11 including the section where the working fluid condenses. In other words, in the vapor chamber 4, the hydrogen occlusion metal 13 is provided in both the evaporation portion and the condensation portion of the container 10.

As illustrated in FIG. 8, in the vapor chamber 4, the coating of the hydrogen occlusion metal 13 is provided on the inner surface 15 of the one plate-shaped body 21.

Further, in the vapor chamber 4, the wick structure 12 extends from one end to the other end of the cavity portion 11 and is provided substantially in the entire plane direction of the cavity portion 11 as illustrated in FIGS. 7 and 8. In other words, the shape in plan view of the wick structure 12 is a U-shape corresponding to the shape in plan view of the cavity portion 11. The wick structure 12 is provided on the inner surface 15 of the one plate-shaped body 21 forming the cavity portion 11. In the vapor chamber 4, the wick structure 12 is disposed in a section not being provided with the hydrogen occlusion metal 13 in the inner surface 15 of the one plate-shaped bodies 21 forming the cavity portion 11. Therefore, either the coating of the hydrogen occlusion metal 13 or the wick structure 12 is disposed all over the inner surface 15 of the one plate-shaped bodies 21 forming the cavity portion 11.

As for the vapor chamber 4, since the non-condensable gas such as hydrogen gas can sufficiently be in contact with the hydrogen occlusion metal 13 independently of the shapes in plan view of the container 10 and the cavity portion 11, excellent cooling properties can be exerted on an object to be cooled even when the vapor chamber is installed in a narrow space. In addition, as for the vapor chamber 4, the non-condensable gas such as hydrogen gas can be surely absorbed independently of the shapes in plan view of the container 10 and the cavity portion 11, even when determination of the position to serve as the condensation portion is difficult depending on usage states of the vapor chamber and the like.

Next, a vapor chamber according to another exemplary embodiment of the present disclosure will be described. In the vapor chambers of the above-mentioned embodiments, the coating of the hydrogen occlusion metal is formed either on the inner surface of the cavity portion or on the wick structure. Instead, the coating of the hydrogen occlusion metal may be formed both on the inner surface of the cavity portion and on the wick structure. In addition, a heat dissipation fin may be mounted to the vapor chamber of each above-mentioned embodiment so that a heat sink having the vapor chamber of each above-mentioned embodiment may be formed.

The vapor chamber of the present disclosure is excellent in the absorption properties for the non-condensable gas such as hydrogen gas and has the thinned container, and thus is available in wide fields, particularly is of high use value in the field of cooling a heat element installed in a narrow space.

What is claimed is:

1. A vapor chamber comprising: a container in which a cavity portion is formed in an inside; a wick structure provided in the cavity portion; a working fluid enclosed in the cavity portion; a vapor flow path which is formed in the cavity portion and through which the working fluid in a gas phase flows; and a hydrogen occlusion metal that is disposed in the cavity portion and absorbs hydrogen at 350° C. or lower and does not release hydrogen at 350° C. or lower,
    the hydrogen occlusion metal being coated in a region in contact with the working fluid in an inner surface of the cavity portion and/or the wick structure,
    wherein the container is a planar container that is formed by one plate-shaped body and another plate-shaped body facing the one plate-shaped body,
    the hydrogen occlusion metal is disposed in a section where the working fluid condenses,
    the wick structure is provided in a plurality of rows and extends in a fence-shaped manner, and the wick structure is interposed between a plurality of protruding portions of the other plate-shaped body and the one plate-shaped body to be fixed in the container, but no wick structure is provided between the plurality of protruding portions,
    the hydrogen occlusion metal is provided in the entire cavity portion or in a section of the cavity portion that is other than an evaporation portion and includes a condensation portion,
    a ratio of a thickness of the vapor flow path directly above the coating of the hydrogen occlusion metal to a thickness of the coating of the hydrogen occlusion metal is 0.50 or greater and 20 or lower, and
    both the hydrogen occlusion metal and the wick structure are provided on an inner surface of the one plate-shaped body.

2. The vapor chamber according to claim 1. wherein the coating of the hydrogen occlusion metal is at, least one layer selected from the group consisting of a plating layer, a sputtering layer, and a vapor deposition layer.

3. The vapor chamber according to claim 1, wherein an average thickness of the coating of the hydrogen occlusion metal is 0.01 mm or greater and 0.10 mm or lower.

4. The vapor chamber according to claim 1, wherein the hydrogen occlusion metal is a titanium-based material, a palladium-based material, a vanadium-based material, a calcium-based material, or a composite material of these materials.

5. The vapor chamber according to claim 1, herein the hydrogen occlusion metal is a composite material of titanium and palladium.

6. The vapor chamber according to claim 1, wherein a material of the container is copper, a copper-based alloy, iron, a ferroalloy, stainless steel, aluminum, an aluminum-based alloy, nickel, or a nickel-based alloy.

7. The vapor chamber according to claim 1, wherein a material of the container is stainless steel.

8. The vapor chamber according to claim 1, wherein an amount of hydrogen gas in the cavity portion is 10% by volume or lower of a total amount of gases in the cavity portion at an operation temperature of 50° C.

9. A heat sink comprising the vapor chamber according to claim 1.

10. The vapor chamber according to claim 1, wherein the hydrogen occlusion material absorbs a non-condensable gas.

* * * * *